US005559661A

United States Patent [19]
Meinders

[11] Patent Number: 5,559,661
[45] Date of Patent: Sep. 24, 1996

[54] SHORT-CIRCUIT-PROOF TRANSISTOR OUTPUT STAGE, ESPECIALLY IGNITION OUTPUT STAGE FOR MOTOR VEHICLES

[75] Inventor: Horst Meinders, Reutlingen, Germany

[73] Assignee: Robert Bosch GmbH, Stuttgart, Germany

[21] Appl. No.: 273,316

[22] Filed: Jul. 11, 1994

Related U.S. Application Data

[63] Continuation of Ser. No. 860,512, Jun. 11, 1992, abandoned.

[30] Foreign Application Priority Data

Mar. 23, 1990 [DE] Germany .................... 40 09 304.2

[51] Int. Cl.$^6$ ............................................ H02H 3/00
[52] U.S. Cl. ................................................. 361/93; 361/54
[58] Field of Search .................... 361/54, 18, 56, 361/92, 93; 123/630; 323/278

[56] References Cited

U.S. PATENT DOCUMENTS 4,477,747  10/1984  Wakai et al. .................... 315/200 A

FOREIGN PATENT DOCUMENTS 0032985  8/1981  European Pat. Off. ......... H03K 5/02

*Primary Examiner*—Jeffrey A. Gaffin
*Assistant Examiner*—Sally C. Medley
*Attorney, Agent, or Firm*—Michael J. Striker

[57] ABSTRACT

A short-circuit-proof transistorized ignition output stage for motor vehicles, has a power transistor (10) connected in series to a primary winding (11) of an ignition coil (12), and a blocking arrangement including a first switching transistor for turning off the power transistor in the event of a very small voltage drop indicative of a short circuit in the coil (12). The voltage drop detector includes a second switching transistor (23') whose base-emitter path is connected across the primary winding (11) and whose collector-emitter path controls the base of a third switching transistor (25) of opposite conductivity type. The collector-emitter path of the third switching transistor (25) is connected in parallel to the base-emitter path of the first switching transistor (27) and the collector-emitter path of the first switching transistor is connected in parallel to the base-emitter path of the power transistor (10). Preferably, the entire output stage consists of a monolithic integrated circuit.

19 Claims, 5 Drawing Sheets

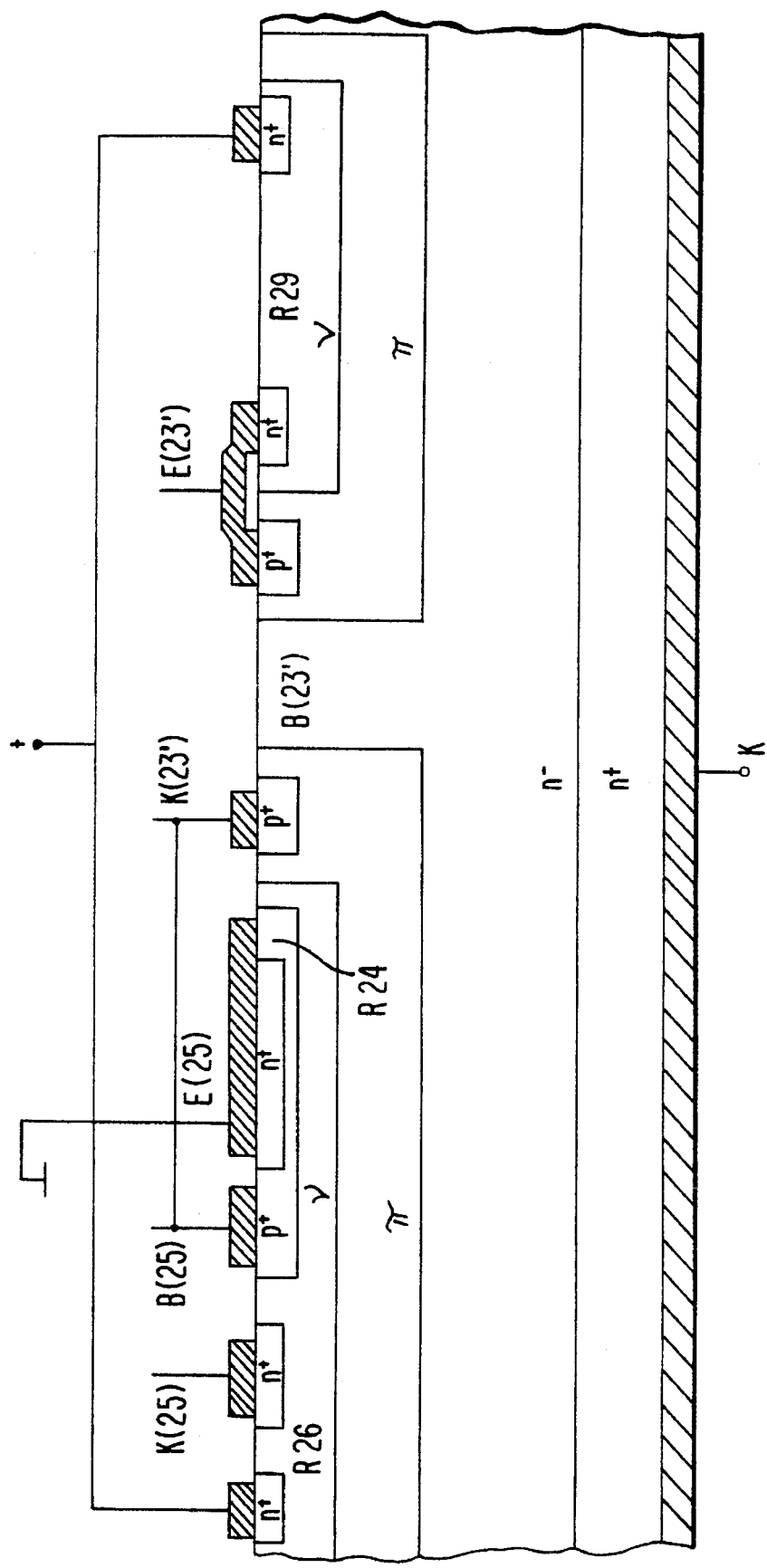

SHORT-CIRCUIT-PROOF TRANSISTOR OUTPUT STAGE, ESPECIALLY IGNITION OUTPUT STAGE FOR MOTOR VEHICLES

This is a continuation of application Ser. No. 07/860,512 filed Jun. 11, 1992 now abandoned.

BACKGROUND OF THE INVENTION

The invention relates to a short-circuit-proof transistor output stage, especially ignition output stage for motor vehicles having a power transistor connected in series to a load, and having a blocking device for turning off the power transistor in the event of a short circuit in the load.

In ignition systems for motor vehicles, an ignition transformer (ignition coil) is turned on and off by a power Darlington pair in order to generate an ignition spark. This power Darlington pair connected in the primary circuit of the ignition coil switches coil currents between 5 and 15 amperes. In rare cases, the ignition transformer can be damaged by salt water, dirt, high voltage discharges or excess temperature, so that a primary-side short circuit is produced. Here, due to the battery voltage, the saturation voltage of the transistor and cable resistances give rise to currents of between 20 and 30 amperes, which destroy the output stage of the power Darlington pair, and thus the ignition system.

In order to prevent such a destruction in the event of a short circuit, it is known to turn off the output stage upon overshooting of an upper current threshold. The known arrangement has, however, the disadvantage that despite the short circuit of the ignition coil the power Darlington pair always turns on again upon undershooting of this current threshold. Since this switching operation occurs at very high currents and also high frequencies, the output stage can nevertheless be damaged.

A further known method consists in bonding a temperature sensor to the chip, or integrating it into the output stage. The disadvantage of these sensors resides in their inertia. The output stage can already be destroyed when the excess temperature is displayed and the Darlington pair is turned off.

SUMMARY OF THE INVENTION

The transistor output stage according to the invention has the advantage that in the event of a short circuit in the primary circuit of the ignition coil the output stage transistor is not only turned off but also remains permanently turned off. The turn-off response does not depend on the gain characteristic of the power transistor. There is thus no need for individual current compensation to adjust the turn-off current. In the event of a short circuit, the short circuit current continues to flow only until the short-circuited ignition coil has discharged its energy. The transistor output stage according to the invention is well suited for monolithic integration.

Preferred embodiments of the above-described transistor output stage having various advantages are described hereinbelow.

A particularly simple arrangement is produced when the first switching transistor, which conducts current in the event of a short circuit, can be controlled by at least one second switching transistor, to whose control side at least a part of the voltage drop at the load is applied. If one terminal of the load is connected to the positive pole of a supply voltage source, at least a part of the voltage drop tapped at the load can expediently be applied to the emitter-base junction of the second switching transistor, which is constructed as a pnp transistor and is blocked in the event of a short circuit.

In an embodiment a voltage divider is connected in parallel to the load, the voltage drop across a component resistor, connected to the positive pole of the supply voltage source, of the voltage divider being applied to the emitter-base junction of the second switching transistor. In this arrangement, a swamping resistor of 10 to 250 ohms between the voltage divider tap and the second switching transistor advantageously serves the purpose of protecting against turn-on voltage flanks at the collector of the power transistor and of temperature compensation of the switching level of the switching transistor, due to the fact that the negative temperature response of the emitter-base voltage across this resistor is brought to a positive temperature response of the entire emitter-base and resistor junction.

In the monolithic integration of this arrangement, the base of the second switching transistor, which is constructed as a vertical pnp transistor, is constructed as a weakly n-doped v zone, and the collector as a weakly p-doped $\pi$ zone. In this arrangement, the weakly doped zones serve the purpose of electrical insulation with respect to the power transistor. The divider resistors of the voltage divider are produced in this case from differently conducting silicon, so that the divider ratio acquires a temperature response corresponding to the temperature response of the copper resistor of the load, that is to the primary winding of the ignition coil, in so that the switching threshold for turning off the load current is temperature-compensated.

In another advantageous embodiment the base-emitter junction of the second switching transistor is connected in parallel to the load, the voltage divider being eliminated. This enables an especially simple monolithic integration of the output stage by connecting the collector of the power transistor to the n-base of this second switching transistor, which is constructed as a lateral pnp transistor. The n-base of this switching transistor thus corresponds to the substrate and therefore to the collector of the power transistor. The integration can be represented in $\pi$–$n^-$–$\pi$ technology.

In order to limit the through-current, an emitter resistor is further provided here in addition to a collector resistor. Because of the missing voltage divider, the entire voltage drop across the load can be used to turn on the second switching transistor, and an additional voltage drop at the emitter resistor is not detrimental to this turning on of the second switching transistor.

Because of the low current amplification of the second switching transistor, especially in the version without voltage divider, the collector of this second switching transistor is connected to a third switching transistor, which can be turned on by the collector current, and blocks in the turned-on, current-conducting state the first switching transistor. As a result, a reliable turning-off of the first switching transistor is ensured.

For the purpose of reliably turning on the power transistor, its base is connected via a low-resistance resistor of less than 200 ohms, preferably 1–2 ohms, to the first switching transistor. Soft switching is possible as a result, and the Darlington pair can be turned on despite the turned-on first switching transistor, because the load immediately signals "no short circuit", and the first switching transistor is thereby blocked.

The point of common coupling between the power transistor and the load is connected via a high-blocking protective Zener diode to the blocking device for blocking the power transistor, so that when the power transistor is turned off the voltage of several hundred volts which occurs cannot destroy the switching transistors.

It is advantageous to provide an AND circuit which turns off the power transistor only when a short circuit in the load and a drive signal for the power transistor occur simultaneously.

The power transistor is expediently constructed as an npn Darlington pair which is especially suitable for driving a primary winding of an ignition coil as load.

BRIEF DESCRIPTION OF THE DRAWING

Exemplary embodiments of the invention are represented in the drawing and explained in more detail in the following description.

FIG. 7 shows the diffusion zones in accordance with the third exemplary embodiment.

DETAILED OF THE EXEMPLARY EMBODIMENTS

Figure 1:
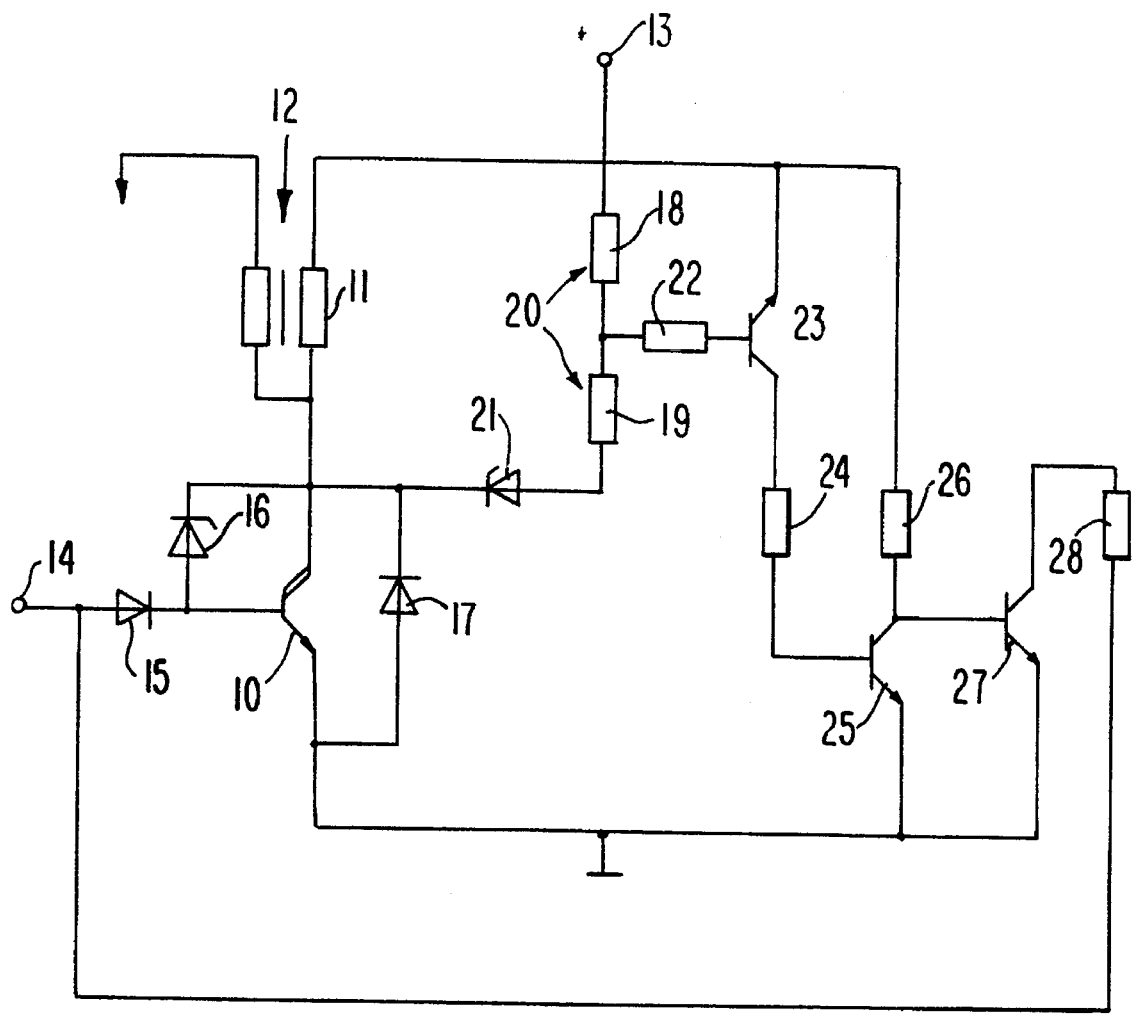
FIG. 1 shows a circuit diagram of a first exemplary embodiment of the short-circuit-proof transistor output stage having a voltage divider in parallel to the primary winding of an ignition coil.

In the first exemplary embodiment represented in FIG. 1, the switching junction of an npn power Darlington pair 10 (designated below as a power transistor) is connected in series to a primary winding 11 of an ignition coil 12, as is used in conventional fashion in a motor vehicle to generate ignition sparks in combustion chambers. The emitter of the power transistor 10 is connected in this arrangement to ground, while the terminal of the primary winding 11 not directly connected to the power transistor 10 is connected to the positive terminal 13 of a supply voltage source which is constructed in the case of a motor vehicle as a battery. A control input 14 of the short-circuit-proof transistor output stage is connected via a decoupling diode 15 to the base of the power transistor 10, which is connected via a clamping Zener diode 16 to the collector of the power transistor 10. Furthermore, the switching junction of the power transistor 10 is bridged by a free-running diode 17.

The series circuit of a voltage divider 20, consisting of two divider resistors 18, 19, and a high-blocking protective Zener diode 21 is connected in parallel to the primary winding 11. The tap of the voltage divider 21 is connected via a swamping resistor 22 to the base of a second pnp switching transistor 23, whose emitter is connected to the positive terminal 13 and whose collector is connected via a collector resistor 24 to the base of the third npn switching transistor 25. The emitter of this third switching transistor 25 is connected to ground, while the collector is connected both via a resistor 26 to the positive terminal 13 and directly to the base a first npn switching transistor 27. The emitter of this first switching transistor 27 is connected to ground, and the collector is connected to the control input 14 via a resistor 28.

The operation of the short-circuit-proof transistor output stage represented in FIG. 1 is as follows: When the ignition coil that is not short-circuited the voltage drop across the primary winding 11 is applied to the voltage divider 20, as a result of which this second switching transistor 23 is turned on, that is to say conducts. Consequently, a collector current flows to the third switching transistor 25, as a result of which the latter is likewise turned on. Consequently, the emitter-base junction or path of the first switching transistor 27 is short-circuited in turn and the latter blocks. The power transistor 10 can thereby be controlled via the control input 14 in order to generate ignition sparks without being impaired by the blocking device formed by the components 18–28.

In the event of a short circuit, no voltage or only a very slight voltage is connected to the voltage divider 20, as a result of which the second switching transistor 23 blocks and likewise transfers the third switching transistor 25 to the blocked state. Consequently, the first switching transistor 27 is turned on via the resistor 26 into a current-conducting state, so that the base-emitter path of the power transistor 10 is short-circuited via the low-resistance resistor 28 and the switching junction or path of the first switching transistor 27. The power transistor 10 is thereby blocked and remains blocked. The current flowing in the coil is now slowly reduced in the course of 10–15 ms, this slow current drop being incapable of acting detrimentally on the ignition response, because it is thus impossible to generate any further ignition sparks. The perfect functioning of the short-circuit turn-off must be ensured in all the switching states of the power transistor 10. The following switching states of the transistor output stages are possible in this arrangement:

1. Power transistor turned off.

In this switching state, the supply voltage is connected to the collector of the power transistor 10, as a result of which there is no voltage drop across the primary winding 11. The switching transistors 23 and 25 are turned off, and the first switching transistor 27 conducts current. By soft switching via the low-resistance resistor 28, which has less than 200 ohms and preferably 1–2 ohms, it is possible to turn on the power transistor 10 despite the current-conducting switching transistor 27, because the ignition coil very rapidly signals "no short circuit", and blocks the switching transistor 27 via the two other switching transistors 23 and 25.

2. Power transistor turned on and in saturation.

Upon turning on the power transistor 10, the voltage $R_z \cdot I_C + L_z \cdot |dI_C/dt|$ drops across the primary winding 11. In this case, $R_z$ the resistance of the primary winding, $L_z$ the coil inductance, and $I_C$ the collector current of the power transistor. The voltage drop across the primary winding 11 is 11 to 12 volts in this phase. The collector-emitter voltage of the power transistor is depressed to low values (saturation voltage) by the mutual induction. If the two divider resistors are adjusted, for example, to 1 kohm each, the divider resistor 18 is short-circuited[by the emitter-base junction or path of the switching transistor 23, and the cross-current of the voltage divider 20 is determined only by the resistor 19 (neglecting the resistor 22). At approximately 10 mA, it produces no essential change in the coil current.

3. Power transistor turned on, in active operation.

After approximately 5 ms, all that remains across the primary winding 11 is the voltage $R_Z \cdot I_C$, because the mutual induction voltage has decayed. The collector-emitter voltage of the power transistor thus; rises to values of 8 to 9 volts, and it is in active operation. Even in the case of this purely ohmic voltage drop, it is ensured in the case of a divider ratio of approximately 1:1 that the switching transistors 23 and 25 are turned on when the primary winding is not short-circuited. However, given suitable dimensioning of the voltage divider 20 and selection of different resistance materials for the divider resistors 18 and 19, the circuit additionally offers the possibility of protecting the power transistor against excessively long operation in the active region with the attendant high turn-on losses. The swamping resistor 22, which compensates the negative temperature response of the emitter-base voltage of the switching transistor 23, serves to achieve a temperature-stable turn-off current.

4. Turn-off phase (collector of the power transistor at high voltage).

When the collector current is turned off, voltages of up to 400 volts occur at the collector of the power transistor 10, depending on design. In the clamping mode, the Zener diode 21, which has a blocking capacity of more than 400 volts, decouples the blocking device with the three switching transistors from the collector potential of the power transistor. In the clamping operation, the switching transistors 23 and 25 are blocked, while the switching transistor 27 is turned on. The base of the power transistor is thus turned off in each turning-off process via the resistor 28. The clamping Zener diode 16 used for voltage limiting of the power transistor is not connected together with the line leading to the collector of the switching transistor 27 to the base of the power transistor 10. If the clamping is performed externally, that is to say via a Zener diode, which is present in the separate driving circuit and is stepped up with the aid of a clamping divider, the driving point is decoupled from the clamping circuit with the aid of the decoupling diode 15.

Figure 3:
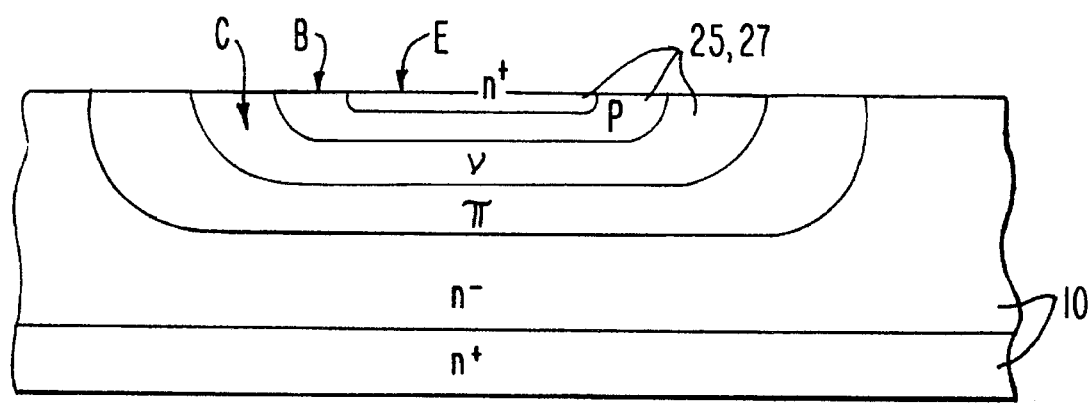
FIG. 3 shows the representation of the diffusion zones of the first and third switching transistor, which are constructed as vertical npn switching transistors.

The entire transistor output stage is preferably designed as a monolithically integrated circuit. The diffusion zones of the npn switching transistors 25 and 27 are represented in FIG. 3. The emitter (E) of these switching transistors consists of an $n^+$ layer, the base (B) of a p layer, and the collector of a σ layer. In these vertical npn switching transistors, the electrical insulation with respect to the potential of the power transistor 10 (lower $n^-$ and $n^+$ layers) is performed via the additional zone π, which is weakly p-doped. The weakly n-doped ν layer also contributes to the electrical insulation. Since only at most 2 to 3 volts are connected to the collectors of the switching transistors 25 and 27, there is no risk of parasitic thyristor ignition (latching).

Figure 4:
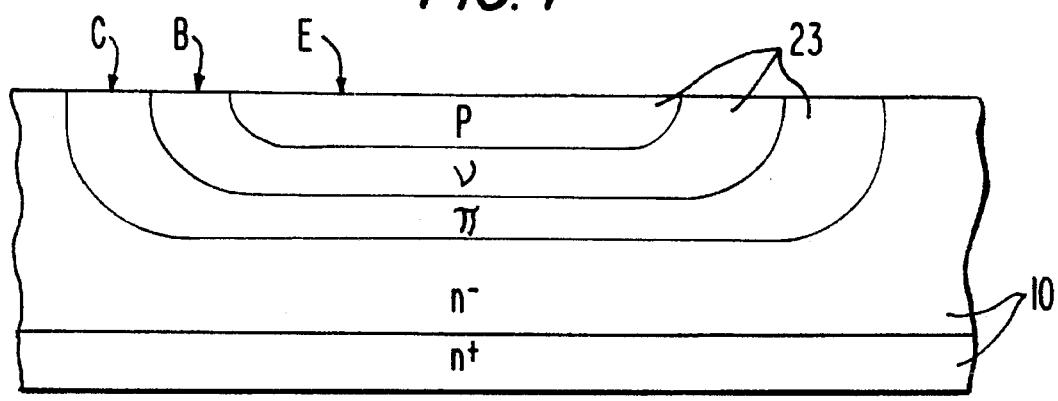
FIG. 4 shows the diffusion zone of the second switching transistor in accordance with FIG. 1, which is constructed as a vertical pnp switching transistor.

This argument does not hold in the case of a vertical second pnp switching transistor 23, which is represented in FIG. 4. Since here the emitter is connected to the positive terminal 13 of the supply voltage source (14 volt), latching of the p, ν, π, $n^-$ layers can occur when the collector of the Darlington pair is in saturation (2 volts). Since no current-limiting resistor is present, this latching can lead to destruction of the switching transistor 27. This latching can be avoided by worsening the tendency to thyristor ignition by forming a shorted emitter between the p and the ν layer. Otherwise, there is a weakly p-doped π layer here as well.

The divider resistors 18 and 19 are formed in a manner not represented by differently doped p-materials, as a result of which the positive temperature response of the copper coil resistor of the primary winding 11 can be compensated. The divider ratio of the voltage divider 20 acquires a temperature response such that it corresponds to the temperature response of the copper resistor of the primary winding 11, so that the switching threshold for turning off the ignition coil current is temperature-constant.

The circuit can be used as a current regulator circuit. For this purpose, the voltage divider is designed such that the power transistor is adjusted after decay of the induction voltage in the case of the regulation current $I_R$. This regulation current can be selected in accordance with the following equation I:

$$R_Z \cdot I_R \cdot R_1 / (R_1 + R_2) = 0.7 \ V = S \quad (I)$$

Here, S is the switching threshold of the pnp transistor, $R_Z$ the coil resistance, $R_1$ the divider resistor 18, and $R_Z$ the divider resistor 19.

Figure 2:
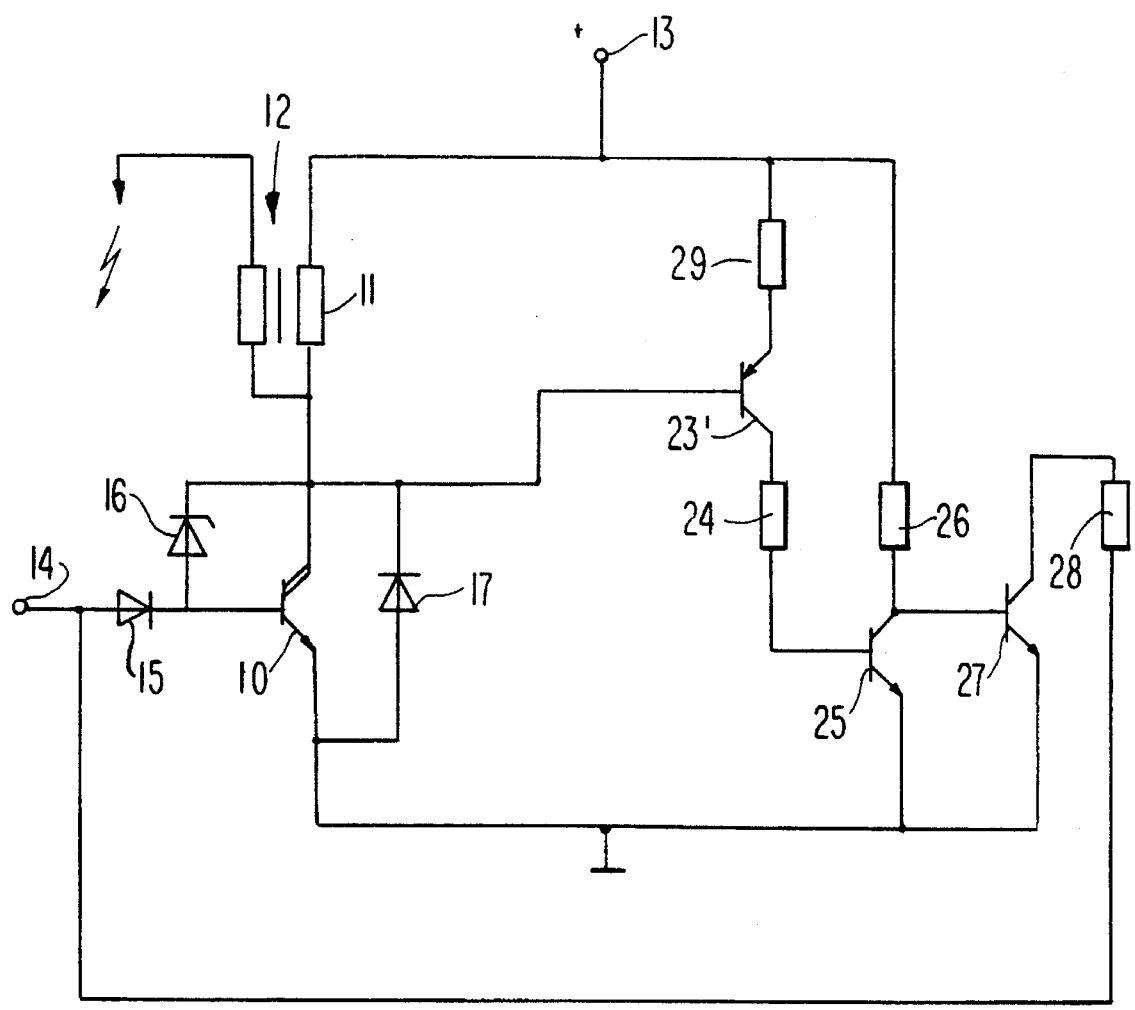
FIG. 2 shows the circuit diagram of a second exemplary embodiment without such a voltage divider.

The second exemplary embodiment represented in FIG. 2 largely corresponds to the first exemplary embodiment, components that are the same or have the same effect being provided with the same reference symbols and not being redescribed.

Figure 5:
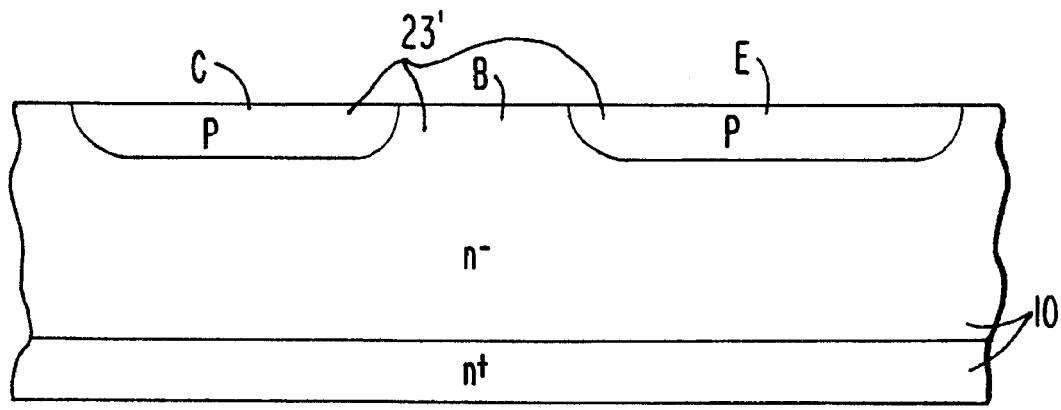
FIG. 5 shows the diffusion zones of the second switching transistor in accordance with FIG. 2, which is constructed as a lateral pnp switching transistor.

The voltage divider 20, the swamping resistor 22 and the Zener diode 21 are eliminated. Instead of the second switching transistor 23, which is constructed as a vertical pnp switching transistor, a lateral pnp switching transistor 23' now occurs, as represented in FIG. 5. In the clamping case, the base of this switching transistor 23' must be able to block the high voltage from the power transistor 10 both to the emitter and to the collector. Consequently, the two p troughs of the emitter (E) and the collector (C) may not be brought too close to one another. In order, nevertheless, to limit the breakdown current, a further emitter resistor 29 is provided between the emitter and the terminal 13 in addition to the collector resistor 24. Because of the missing voltage divider, it is possible here to use the entire voltage drop across the primary winding 11 to turn on the switching transistor 23' an additional voltage drop across the emitter resistor 29 not being detrimental. Since the lateral switching transistor 23' has a very low current gain (1–5), it must already be possible for the switching transistor 25 to be turned on by the low base current (1–2 mA) coming from the switching transistor 23'. A current gain of 50–60 is required for this purpose, in order to ensure that the switching transistor 27 is reliably turned off.

Figure 6:
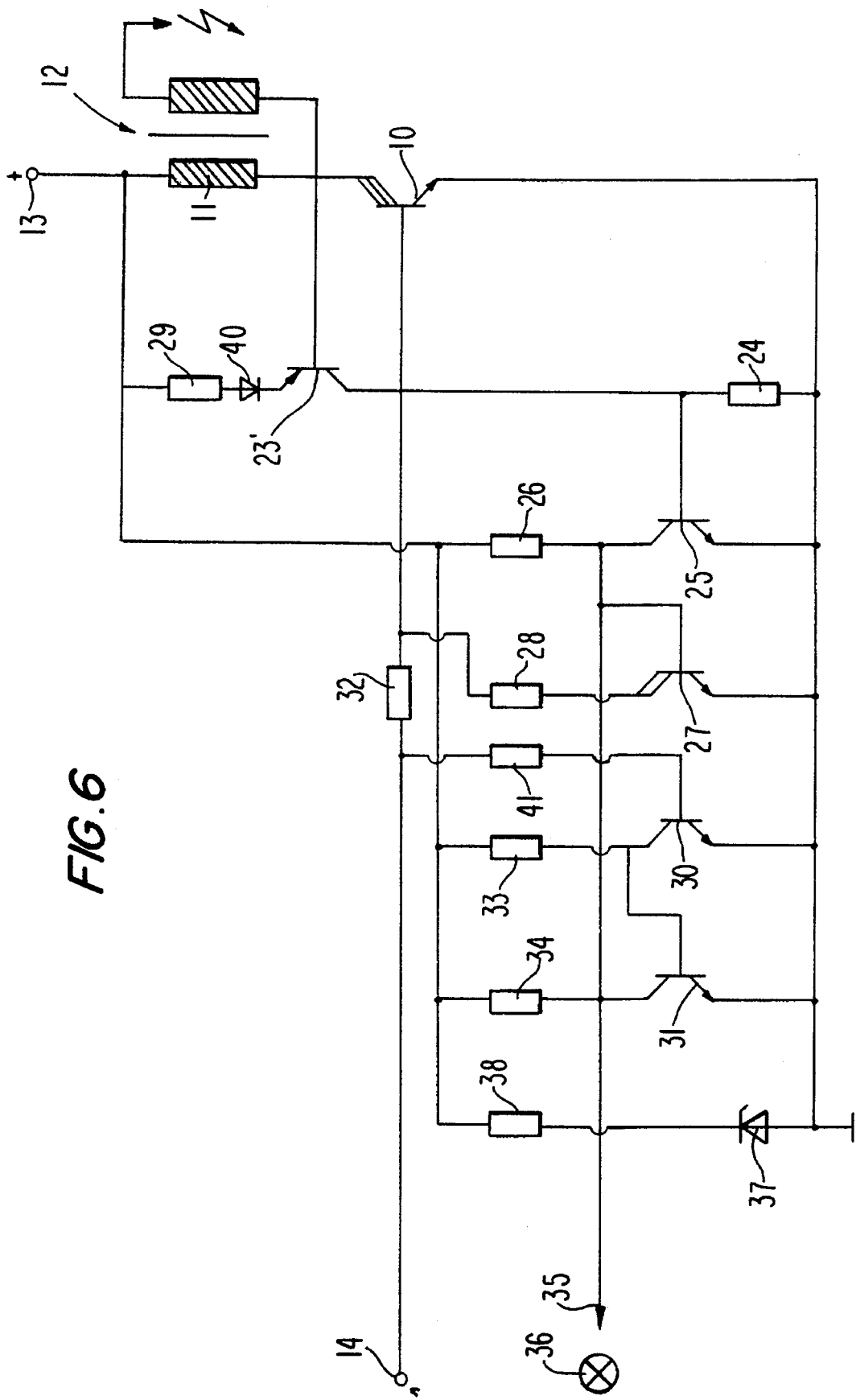
FIG. 6 shows the circuit diagram of a third exemplary embodiment.

The design principle of the third exemplary embodiment, represented in FIG. 6, corresponds to the second exemplary embodiment, components that are the same or have the same effect being provided with the same reference symbols and not redescribed in detail. By contrast with the second exemplary embodiment, the collector of the second switching transistor 23', which is constructed in turn as a lateral pnp switching transistor, is now directly connected to the base of the third switching resistor 25, while the collector transistor 24 is now connected between the collector of the switching transistor 23' and ground. It has a typical value of 100 ohms. The diode 15 is eliminated, as are the diodes 16, 17, it being possible, of course, for the latter to be used here as well, if required. In addition, a protective diode 40 is connected between the emitter of the switching transistor 23' and the emitter resistor 29.

A fourth switching transistor 30 and a fifth switching transistor 31 are provided for the purpose of producing a logic AND circuit for the occurrence of a coil short circuit and a positive drive signal at the control input 14. The base of the fourth switching transistor 30 is connected via a series resistor 41 of, for example, 2 kohms to the control input 14, which is now connected via a base input resistor 32 to the base of the power transistor 10. The emitters of the two switching transistors 30, 31 are connected to ground, and the two collectors are respectively connected via a resistor 33, 34 to the positive terminal 13 of the voltage source. Furthermore, the collector of the fourth switching transistor 30 is connected to the base of the fifth switching transistor 31 whose collector is connected in turn both to the collector of the switching transistor 25 and to a control output 35 which serves to control a control lamp 36. Finally, the series circuit of a Zener diode 37 and a resistor 38 is connected in parallel to the voltage source.

In this exemplary embodiment, as well, the second switching transistor 23' is in turn always turned on when a voltage builds up across the primary winding 11 in a direction such that the collector of the power transistor 10 is at a more negative voltage than the positive supply voltage of the ignition coil 12. This voltage for turning on the switching transistor 23' is produced precisely when the ignition coil 12 is in order and the Darlington pair is turned on. The voltage drop across the primary winding 11 is composed of the purely ohmic coil component $I \cdot R_L$ and predominantly of the inductive component $L \cdot dI/dt$. Given a typical coil resistance of 0.4 ohms and currents above 8 amperes, the voltage drop across the primary coil 11 always suffices for turning on the switching transistor 23'. The switching transistor 25 is always in the same switching state as the switching transistor 23'. When the switching transistor 23' is turned off, that is to say in the event of a short circuit, for example, the base of the switching transistor 25 is reliably grounded via the collector resistor 24. The collector of the switching transistor 25 is then connected to positive potential. It has a lower potential when the coil is in order.

The power transistor 10 is intended to be turned off only in the event of a coil short circuit and the simultaneous occurrence of a positive drive signal at the control input 14. The corresponding logic AND circuit between these two conditions is realized by the switching transistors 30, 31, which generate a powerful, logically usable signal. The drive signal upstream of the base input resistor 32, which normally has a value of 10–20 ohms, is transmitted to the base of the switching transistor 30, whose collector voltage is led in turn to the base of the switching transistor 31 for the purpose of signal inversion. The positive potential of the supply voltage is thus applied to the collector of the switching transistor 31 when a drive signal is connected to the base of the power transistor 10. The collectors of the switching transistors 25 and 31 are connected to one another and are led jointly to the base of the switching transistor 27 which is therefore driven only in the event that the two collectors are simultaneously at positive potential. This is the case only when the primary winding 11 is short-circuited and the power transistor 10 is driven. As in the previous exemplary embodiment, the switching transistor 27 then dissipates the base current of the power transistor 10 in the event of a coil short circuit. When the switching transistor 27 is designed as a single transistor, the resistor 28 must be provided as collector resistor, and be dimensioned in accordance with the condition:

$$(R32+R28) \cdot I_b > 0.7 \text{ V}$$

Here, $I_b$ is the base current. With this dimensioning, there is still a sufficient drive signal for the switching transistor 30 despite the active short circuit of the switching transistor 27. Oscillations can occur upon withdrawal of power if this condition is not fulfilled. The switching transistor 27 can also be designed as a Darlington pair. In this case, in the turned-on state the Darlington pair has a saturation voltage of approximately 1 volt, which suffices to drive the switching transistor 30, which is, however, smaller than the base-emitter voltage of the two-stage (1.4 volts) or three-stage (2.1 volts) Darlington pair, which is thus reliably turned off. In this case, the resistor 28 can be eliminated.

The control lamp 36 is turned on and indicates the short circuit in the event of blockage of the switching transistors 25, 31, that is to say in the event of short-circuiting of the primary winding 11.

The following table I show the four possibilities for which the short-circuit-proofing is to respond or not respond. It is essential in this case that in consequence of the described AND circuit the short-circuit-proofing responds only in the first case but not, by contrast, in cases two to four. Only in the first case is the control lamp 36 also turned on.

TABLE I

| Short-circuit-proofing Possibilities | | | |
|---|---|---|---|
| | Collector T 25 | Collector T 31 | |
| 1. Coil defective, Darlington pair 10 driven | H | H | → T 27 driven |
| 2. Coil defective, Darlington pair 10 not driven | H | L | → T 27 not driven |
| 3. Coil in order, Darlington pair 10 driven | L | H | → T 27 not driven |
| 4. Coil in order, Darlington pair 10 not driven | H | L | → T 27 not driven |

The terminal 13 is connected to the positive pole of the supply voltage source, that is to say normally to the positive terminal of the motor vehicle battery. Here, high overvoltages can occur when inductances are disconnected in the motor vehicle. These turn-off peaks can amount to 100–150 volts, and protection against these turn-off peaks is required. For this reason, the Zener diode 37, which has a breakdown voltage of more than 30 volts and is in series with the resistor 38 serving as current-limiting resistor is connected in parallel to the voltage source. The switching transistors 25, 30, 31 are protected against such overvoltages (load dump) by this Zener diode 37. The switching transistor 23' does not require this protection, because owing to its design (two base troughs in the substrate, see FIG. 7) it inherently has a high blocking capability.

The entire circuit, that is to say the power transistor, the switching transistors, the resistors and the Zener diode, are preferably also designed in this exemplary embodiment as a monolithically integrated circuit. In this case, the monolithic representation of the power transistor, which is constructed as a Darlington pair, with the additional components of inverse diode, emitter-base resistors, Zener diode for clamping voltage limitation and the like; are presumed to be known and are not explained in more detail here.

FIG. 7 shows the integration of the transistors 23' and 25 with the resistors 29 and 24 as a detailed feature of the monolithically integrated circuit. In a known way, the n-substrate material has on its rear the rear diffusion profile $n^+$ with collector terminal metallization. This substrate is thus at the potential of the power Darlington pair. In order to isolate this potential from the potential of the switching transistors, isolating ν and π diffusion zones have been inserted between the substrate and the $p^+$ and $n^+$ layers of the switching transistors. The concentrations of the ν and π zones are selected such that they have a blocking capability with respect to one another of more than 100 volts. The potentials of the power Darlington pair and the switching transistors are thus effectively insulated from one another in the case of all the turn-on processes.

The emitter (E) and the collector (C) of the pnp transistor 23' are represented by the two π troughs. The base is identical to the collector of the power Darlington pair. The current-limiting emitter resistor 29 consists of ν material and has typical values of 100 ohms, which with the area resistance of 100–200 ohms/square can easily be represented. The $p^+$ and $n^+$ diffusions onto the contact windows are intended here only to ensure effective ohmic contact of the ν and π zones. The npn transistor 25 (left-hand part in FIG. 7) consists of the vertical structure: $n^+$ (emitter), $p^+$ (base) and ν (collector), which is once again provided with the $n^+$contact diffusion. The emitter-base resistor 24 made of $p^+$ material is represented here. Resistances of 100–200 ohms can be effectively realised using the $p^+$ area resistance of 50 ohms/square.

The collector resistor 26 is further represented in FIG. 7. It has typical values of 1–5 kohms, and can likewise be implemented with ν material without consuming too much space.

The integration of the remaining switching transistors 27, 30 and 31 with their resistors is performed in an analogous way, and will not therefore be described in detail once again. The protective Zener diode 37 can be implemented as a $p^+$–ν diode, or as a $p^+$ diode chain for amplifying the Zener voltage. Here, too, the resistor 38 is produced from ν material in accordance with the resistor 29.

The exemplary embodiments have npn power Darlington pairs in conjunction with an ignition coil. However, as a departure from this it is also possible to drive a different, arbitrary load by a short-circuit-proof transistor output stage, in which a power Darlington pair is replaced by a different power transistor, which can also be constructed as a pnp transistor.

While the invention has been illustrated and described as embodied in a short-circuit-proof transistor output stage, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

I claim:

1. Short-circuit-proof transistor output stage which forms an ignition output stage for a motor vehicle, including a power transistor (10) having a collector-emitter path connected in series to a load (12); voltage detection means for detecting voltage drop across the load when a short circuit occurs in the load, and a blocking device including a first switching transistor (27) for turning off the power transistor when a voltage drop is detected by the detection means, said detection means comprising a second switching transistor (23) and a third switching transistor (25) of opposite conductivity type, a base-emitter path of said second switching transistor (23') being connected across said load (12), an emitter-collector path of said second switching transistor being connected in series with a base-emitter path of said third switching transistor (25) and a collector-emitter path of said third switching transistor being connected parallel to a base-emitter path of said first switching transistor so that during normal condition of the load the third switching transistor (25) is turned-on by a collector current of the second switching transistor (23) and blocks the first switching transistor (27), while in the event of a short-circuit the second and third switching transistors are blocked, the first switching transistor is turned on and the power transistor is blocked, and a transistor switching stage connected to a base of the power transistor (10) and including a fourth switching transistor (30) and a fifth switching transistor (31), a collector of the fifth switching transistor (31) being connected with a collector of the third switching transistor (25), the collector of the fifth switching transistor (31) being at positive potential when a drive signal is present for the power transistor (10) and the first switching transistor (27) leading away a base current for the power transistor (10) to earth only when both the collector of the third switching transistor (25) and the collector of the fifth switching transistor (35) are at the positive potential.

2. Transistor output stage according to claim 1, further comprising a supply voltage source having a positive pole, and wherein the load (12) has two terminals, the second switching transistor (23) being a pnp transistor having a collector, a base and an emitter as well as an emitter-base path, and one of the terminals of the load (12) is connected to the positive pole of the supply voltage source and the voltage drop across the load is applied to the emitter-base path of the second switching transistor to block the second switching transistor when the short circuit occurs.

3. Transistor output stage according to claim 2, wherein the collector of the third switching transistor (25) is connected via a current limiting resistor (26) to the positive pole of the supply voltage source.

4. Transistor output stage according to claim 2, wherein the third switching transistor (25) consists an npn transistor.

5. Transistor output stage according to claim 4, wherein the base of the power transistor (10) is connected by a low-resistance resistor (28) having a resistance of less than 200 ohms to the collector of the first switching transistor (27).

6. Transistor output stage according to claim 5, wherein the first switching transistor consists of a Darlington pair.

7. Transistor output stage according to claim 6, further comprising a control circuit including a control lamp connected to a control output of an AND circuit.

8. Transistor output stage according to claim 1, wherein the blocking device at least in part comprises a monolithic integrated circuit containing the second switching transistor (23, 23') which is formed as a vertical pnp transistor with a base formed as a n-doped u-zone and a collector formed as a p-doped π-zone.

9. Transistor output stage according to claim 1, further comprising an emitter resistor (29) connected to the emitter of the second switching transistor and a collector resistor (24) connected to the collector of the second switching transistor.

10. Transistor output stage according to claim 1, wherein the blocking device at least in part comprises a monolithic integrated circuit containing the second switching transistor (23) and said second switching transistor consists of a lateral pnp transistor having an n-base as the base.

11. Transistor output stage according to claim 1, wherein the load (12) is the primary winding (11) of an ignition coil.

12. Transistor output stage according to claim 1, further comprising an overload protection device consisting of a Zener diode (37) connected in series to a current-limiting resistor (38), said current limiting resistor being connected to a supply voltage source.

13. Transistor output stage according to claim 1, wherein the base and emitter layers of the switching transistors are comprised of lower-lying ν layer and a π layer for electrical insulation.

14. Transistor output stage according to claim 13, wherein an AND circuit is formed by a connection of a switching path of the transistor switching stage (30, 31) and a switching path of the third switching transistor (25).

15. Transistor output stage according to claim 13, consisting of a monolithic integrated circuit.

16. Transistor output stage according to claim 15, wherein the second switching transistor (23') comprises a plurality of π, n⁻, π layers, and the base layer of the second switching transistor (23') simultaneously provides the collector of the power transistor (10).

17. Transistor output stage according to claim 16, further comprising an emitter resistor (29) connected to the second switching transistor (23') and wherein said emitter resistor (29) is made of a ν material.

18. Transistor output stage according to claim 16, wherein the switching transistors consist of vertical $n_+$, $p_+$ and ν layers, each of said vertical layers being separated electrically from the collector of the power transistor (10) by a high-resistance insulating trough.

19. Transistor output stage according to claim 18, further comprising a collector resistor (26, 28, 33, 34) for the first, the third, the fourth and the fifth switching transistor (25, 27, 30, 31) made of u material and an resistor which is connected with the base and the emitter of a third switching transistor (25) consisting of $p_+$ material.

* * * * *